United States Patent
Yogev et al.

(10) Patent No.: US 6,933,464 B2
(45) Date of Patent: Aug. 23, 2005

(54) LASER-DRIVEN CLEANING USING REACTIVE GASES

(75) Inventors: David Yogev, Nesher (IL); Boris Livshitz (Buyaner), Yokneam (IL)

(73) Assignee: Oramir Semiconductor Equipment Ltd., Yokneam (IL)

(*) Notice: Subject to any disclaimer, the term of this patent is extended or adjusted under 35 U.S.C. 154(b) by 0 days.

(21) Appl. No.: 10/611,161

(22) Filed: Nov. 10, 2003

(65) Prior Publication Data
US 2004/0045667 A1 Mar. 11, 2004

Related U.S. Application Data

(62) Division of application No. 09/564,914, filed on May 4, 2000, now Pat. No. 6,627,846.
(60) Provisional application No. 60/172,299, filed on Dec. 16, 1999.

(51) Int. Cl.[7] ............................................. B23K 26/00
(52) U.S. Cl. ............................ 219/121.85; 219/121.83; 219/121.86
(58) Field of Search .................... 219/121.85, 121.84, 219/121.82, 121.83, 121.86

(56) References Cited

U.S. PATENT DOCUMENTS

| | | | | |
|---|---|---|---|---|
| 4,987,286 A | * | 1/1991 | Allen ..................... | 219/121.68 |
| 5,114,834 A | * | 5/1992 | Nachshon ................ | 430/329 |
| 5,669,979 A | * | 9/1997 | Elliott et al. ............. | 134/1 |
| 5,814,156 A | * | 9/1998 | Elliott et al. ............. | 134/1 |

* cited by examiner

*Primary Examiner*—M. Alexandra Elve
(74) *Attorney, Agent, or Firm*—Baker Botts LLP

(57) ABSTRACT

A method and apparatus for removing contaminants from the surface of a substrate. An explosive medium is introduced into a vicinity of the substrate, and a beam of electromagnetic energy is directed toward the substrate. Absorption of the electromagnetic energy causes the explosive medium both to generate a blast wave and to form reactive species, the blast wave and the reactive species cooperating to remove the contaminants from the surface substantially without damage to the surface itself.

11 Claims, 4 Drawing Sheets

LASER-DRIVEN CLEANING USING REACTIVE GASES

CROSS REFERENCE TO RELATED APPLICATION(S)

This application is a divisional of U.S. patent application Ser. No. 09/564,914, filed May 4, 2000 now U.S. Pat. No. 6,627,846, which claims priority of provisional application No. 60/172,299, filed Dec. 16, 1999.

FIELD OF THE INVENTION

The present invention relates generally to processing of semiconductor devices, and specifically to methods and apparatus for removal of foreign particles from semiconductor wafers and masks.

BACKGROUND OF THE INVENTION

Removal of contaminants from semiconductor wafers is a matter of great concern in integrated circuit manufacturing. As the critical dimensions of circuit features become ever smaller, the presence of even a minute foreign particle on the wafer during processing can cause a fatal defect in the circuit. Similar concerns affect other elements used in the manufacturing process, such as lithographic masks.

Various methods are known in the art for stripping and cleaning foreign matter from the surfaces of wafers and masks, while avoiding damage to the surface itself. For example, U.S. Pat. No. 4,980,536, whose disclosure is incorporated herein by reference, describes a method and apparatus for removal of particles from solid-state surfaces by laser bombardment. U.S. Pat. Nos. 5,099,557 and 5,024,968, whose disclosures are also incorporated herein by reference, describe a method and apparatus for removing surface contaminants from a substrate by high-energy irradiation. The substrate is irradiated by a laser with sufficient energy to release the particles while an inert gas flows across the wafer surface to carry away the released particles.

U.S. Pat. No. 4,987,286, whose disclosure is likewise incorporated herein by reference, describes a method and apparatus for removing minute particles (as small as submicron) from a surface to which they are adhered. An energy transfer medium, typically a fluid, is interposed between each particle to be removed and the surface. The medium is irradiated with laser energy and absorbs sufficient energy to cause explosive evaporation, thereby dislodging the particles.

One particularly bothersome type of contamination that is found on semiconductor wafers is residues of photoresist left over from a preceding photolithography step. U.S. Pat. No. 5,114,834, whose disclosure is incorporated herein by reference, describes a process and system for stripping this photoresist using a high-intensity pulsed laser. The laser beam is swept over the entire wafer surface so as to ablate the photoresist. The laser process can also be effected in a reactive atmosphere, using gases such as oxygen, ozone, oxygen compounds, nitrogen trifluoride ($NF_3$), etc., to aid in the decomposition and removal of the photoresist.

European patent publication EP 0 943 390 A2, whose disclosure is incorporated herein by reference, describes a method of surface treatment using multi-laser combustion, providing an improvement on the method of the above-mentioned U.S. Pat. No. 5,114,834. The mechanism of photoresist removal is described as including a localized ejection of the photoresist layer, associated with a blast wave due to chemical bonds breaking in the photoresist and instant heating of the ambient gas. A fast combustion flash of the ablation products occurs due to the photochemical reaction of ultraviolet (UV) laser radiation and the process gases, which may also be due to the blast wave. The combination of laser radiation and fast combustion provides instantaneous lowering of the ablation threshold of hard parts of the photoresist.

Another method for photoresist removal is described in an article by Y. P. Lee, et al., entitled "Steam Laser Cleaning of Plasma-Etch-Induced Polymers from Via Holes," in the *Japanese Journal of Applied Physics* 37 (1998), pp. 3524–3529, which is incorporated herein by reference. An alcohol film is applied to the insides of the via holes prior to irradiation by an excimer laser. Explosive evaporation of the alcohol caused by the laser pulse was found to improve the efficiency of removal of the photoresist from the holes.

PCT patent publication WO 96/06694, whose disclosure is incorporated herein by reference, describes a method for performing surface processing of flat panel display substrates, and particularly for removing photoresist after a photolithography step. A high-intensity pulsed beam of radiation is swept across the surface while a reactive gas is flowed across it. The radiation causes the photoresist material to react with the gas, resulting in gaseous products that are then drawn away from the surface. U.S. Pat. Nos. 5,669,979 and 5,814,156, whose disclosures are likewise incorporated herein by reference, describe further methods of cleaning a substrate surface photoreactively, in a manner that is purported to avoid damaging the surface. A laser beam of UV radiation is swept across the surface, while a flow of a reactant gas is provided in a reaction region so that the gas is excited by the UV laser beam.

U.S. Pat. No. 5,023,424, whose disclosure is incorporated herein by reference, describes a method and apparatus using laser-induced shock waves to dislodge particles from a wafer surface. A particle detector is used to locate the positions of particles on the wafer surface. A laser beam is then focused at a point above the wafer surface near the position of each of the particles, causing an electrical breakdown in the gas above the surface that produces gas-borne shock waves with peak pressure gradients sufficient to dislodge and remove the particles.

SUMMARY OF THE INVENTION

It is an object of the present invention to provide methods and apparatus for efficient removal of contaminants from solid-state surfaces, and particularly for removal of microscopic particles from semiconductor wafers and other elements used in semiconductor device production. The wafers may be bare, or they may have layers formed on their surface, whether patterned or unpatterned.

It is a further object of some aspects of the present invention to provide methods and apparatus for removal of contaminants from wafer surfaces in a manner that reduces the likelihood of damage to the surface.

In preferred embodiments of the present invention, a laser beam excites a process gas in proximity to a wafer surface, for the purpose of removing contaminants from the surface. Excitation of the gas generates reactive species, typically atomic and/or molecular radicals, which rapidly oxidize the contaminants, facilitating their removal. This chemical reaction cooperates with gas-dynamic effects, such as a blast wave, created by the intense laser irradiation. These combined effects substantially reduce the laser energy flux that must be applied to the wafer surface itself in order to achieve complete removal of the contaminants, thereby reducing the likelihood that the surface will be damaged in the process.

In some preferred embodiments of the present invention, the process gas comprises ozone, which is preferably diluted with oxygen gas. Irradiation of the ozone with ultraviolet laser radiation causes rapid dissociation of the ozone molecules into oxygen molecules and atomic oxygen radicals. This rapid dissociation causes an exothermic chain reaction, resulting in a strong local blast wave, which dislodges contaminant particles from the wafer surface. The oxygen radicals generated in the blast aid in the combustion and removal of the particles. Preferably, the ozone concentration is sufficiently high so that most of the laser radiation is absorbed in the gas and converted to blast energy. Thus, relatively little of the radiation reaches the wafer surface, and the probability of thermal or radiation damage to the surface is reduced. Furthermore, because the blast wave is driven by dissociation, rather than by electrical breakdown as in laser cleaning methods known in the art, there is substantially no risk of electrical damage to the wafer due to charging of the surface.

In some preferred embodiments of the present invention, the process gas reacts with heated water vapor in proximity to the wafer to create molecular radicals. Preferably, the process gas comprises a fluorine compound, such as $NF_3$, which forms reactive species that include hydrogen fluoride (HF). Alternatively, the process gas may comprise a compound containing oxygen or another element that reacts with the water to form oxidizing radicals. Typically, the water vapor is introduced into a chamber containing the wafer before the laser excitation is initiated. The vapor condenses on the wafer to form a thin water film, as described, for example, in the above-mentioned U.S. Pat. No. 4,987,286.

Laser irradiation causes explosive evaporation of the water on the wafer, facilitating both the removal of the contaminants from the surface and etching of the contaminants by the HF and/or other reactive species. Preferably, ozone is mixed with the fluorine compound, so that a blast wave is generated as described above, together with high temperatures that increase the rate of formation and reaction of HF. The combined blast wave and chemical effects thus provide more effective contaminant removal than non-reactive methods of laser-driven steam cleaning that are known in the art, particularly when there is chemical adhesion of the contaminants to the wafer surface. The methods of the present invention thus achieve contaminant removal with effectiveness comparable to "wet" processes, but without the need to immerse the wafer in aggressive solvents as is required by wet processes known in the art.

Although preferred embodiments are described herein with reference to semiconductor wafer processing, the principles of the present invention may similarly be applied to remove contaminants from surfaces of other types, such as flat panel displays and photolithography masks, as well as from electrically-conductive surfaces.

There is therefore provided, in accordance with a preferred embodiment of the present invention, a method for removing contaminants from the surface of a substrate, such as a semiconductor wafer, including:

introducing an explosive medium into a vicinity of the substrate; and directing a beam of electromagnetic energy toward the substrate, such that absorption of the electromagnetic energy causes the explosive medium both to generate a blast wave and to form reactive species, the blast wave and the reactive species cooperating to remove the contaminants from the surface substantially without damage to the surface itself.

Preferably, the beam of energy has a wavelength and energy flux selected so as to cause explosive decomposition of the explosive medium, substantially without dependence on photoionization due to the beam. Most preferably, the explosive medium includes ozone, wherein introducing the explosive medium includes introducing sufficient ozone to absorb most of the electromagnetic energy directed at the substrate. Further preferably, introducing the explosive medium includes introducing the medium in sufficient quantity so that the explosive decomposition is caused by absorption of the electromagnetic energy in the medium itself.

Alternatively, the explosive medium includes water, which evaporates explosively to generate the blast wave upon absorption of the electromagnetic energy, and the method includes adding a process gas in the vicinity of the substrate, which decomposes and reacts with the water to form the reactive species.

Preferably, directing the beam of electromagnetic energy includes directing a pulsed laser beam at the substrate. Most preferably, directing the pulsed laser beam at the substrate includes irradiating the substrate at an energy density below an ablation threshold of the contaminants. Optionally, directing the pulse laser beam at the substrate includes inducing a photochemical interaction due to absorption of the electromagnetic energy at a surface of the substrate, so as to cooperate with the blast wave and the reactive species in removing the contaminants.

In a preferred embodiment, introducing the explosive medium includes introducing the explosive medium into a container having an outlet in proximity to the substrate, and directing the beam of electromagnetic energy includes directing the beam into the container, so as to generate the blast wave and the reactive species at the outlet of the container.

There is also provided, in accordance with a preferred embodiment of the present invention, a method for removing contaminants from the surface of a substrate, including:

coating the substrate with a layer of a fluid;

introducing a process gas into a vicinity of the substrate; and directing a beam of electromagnetic energy at the substrate, such that absorption of the electromagnetic energy causes the fluid to evaporate explosively so as to dislodge the contaminants from the surface, and to react with the gas so as to generate reactive species, which react with the contaminants.

Preferably, the fluid includes water, and the process gas includes a fluorine compound, wherein the fluorine compound reacts with the water to form hydrogen fluoride. In a preferred embodiment, the fluorine compound includes nitrogen trifluoride.

Additionally or alternatively, the process gas includes an oxygen compound, preferably ozone.

Preferably, coating the substrate with the layer of fluid includes introducing water vapor into the vicinity of the substrate, so that the vapor condenses onto the substrate.

There is additionally provided, in accordance with a preferred embodiment of the present invention, apparatus for removing contaminants from the surface of a substrate, including:

a chamber, adapted to receive the substrate and having an inlet for introduction of an explosive medium therethrough into a vicinity of the substrate and an outlet for removal of the contaminants; and a source of electromagnetic energy, configured to direct a beam of the electromagnetic energy into the chamber, such that absorption of the electromagnetic energy in the chamber causes the explosive medium both to generate a blast wave and to form reactive species, the blast wave and the reactive species cooperating to remove the contaminants from the surface substantially without damage to the surface itself.

In a preferred embodiment, the chamber includes a container, coupled to the inlet so as to receive the explosive medium, the container having an outlet in proximity to the substrate and including a window that is substantially transparent to the electromagnetic energy, wherein the source of electromagnetic energy is configured to direct the beam through the window of the container, so as to generate the blast wave and the reactive species at the outlet of the container.

There is further provided, in accordance with a preferred embodiment of the present invention, apparatus for removing contaminants from the surface of a substrate, including:

a chamber, adapted to receive the substrate and having an inlet for introduction therethrough of a fluid to coat the substrate and for introduction of a process gas into a vicinity of the substrate, and an outlet for removal of the contaminants; and a source of electromagnetic energy, configured to direct a beam of the electromagnetic energy into the chamber, such that absorption of the electromagnetic energy in the chamber causes the fluid to evaporate explosively so as to dislodge the contaminants from the surface, and to react with the gas so as to generate reactive species, which react with the contaminants.

The present invention will be more fully understood from the following detailed description of the preferred embodiments thereof, taken together with the drawings in which:

DETAILED DESCRIPTION OF PREFERRED EMBODIMENTS

Figure 1:
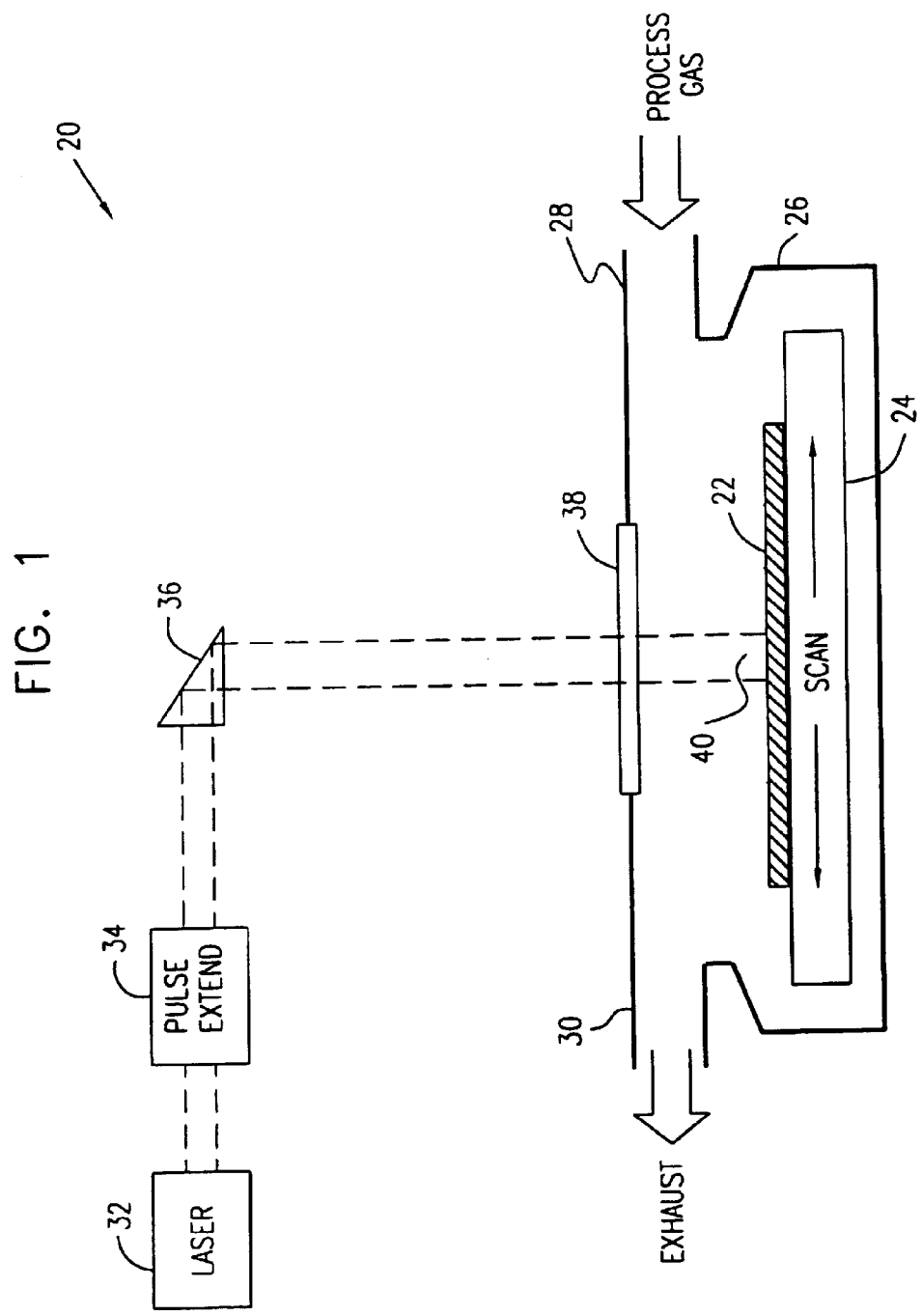
FIG. 1 is a schematic side view of a system for removal of contaminants from the surface of a semiconductor wafer, in accordance with a preferred embodiment of the present invention.

FIG. 1 is a schematic side view of a system 20 for removal of contaminants from the surface of a semiconductor wafer 22, in accordance with a preferred embodiment of the present invention. The wafer is placed on a scanning stage 24 in a chamber 26. A process gas flows into the chamber through an inlet port 28, while waste gas, including residues of contaminants removed from wafer 22, are exhausted through an outlet port 30. Various designs that may be used for chamber 26 are known in the art. A particularly advantageous design is described in PCT patent application PCT/IL99/00701, which is assigned to the assignee of the present patent application, and whose disclosure is incorporated herein by reference. In this design, stage 24 comprises a rotation stage, and ports 28 and 30 are located in close proximity to an area on the wafer at which laser-induced contaminant removal takes place. Optionally, additional gas ports (not shown in the figure) are provided for injecting a laminar flow of an inert background gas across the wafer surface.

A laser 32 generates a pulsed beam that is used in the contaminant removal process. The laser typically comprises an excimer laser, such as a Lambda Physik LPX315 IMC laser, which emits ultraviolet (UV) radiation. Alternatively, other laser types and wavelengths, such as infrared or visible lasers, may be used. When an excimer laser is used, the laser pulses are preferably temporally extended by a pulse extender 34. The laser beam is directed by optics 36 through a suitable window 38 to an interaction region 40 on or in proximity to the upper surface of wafer 22 in chamber 26. Typically, optics 36 also perform the function of scanning the beam in at least one direction over the surface of the wafer. In the configuration described in the above-mentioned PCT patent application PCT/IL99/00701, substantially the entire surface of wafer 22 is covered by rotating stage 24 and scanning the laser beam radially between the center of the wafer and its periphery.

Figure 2:
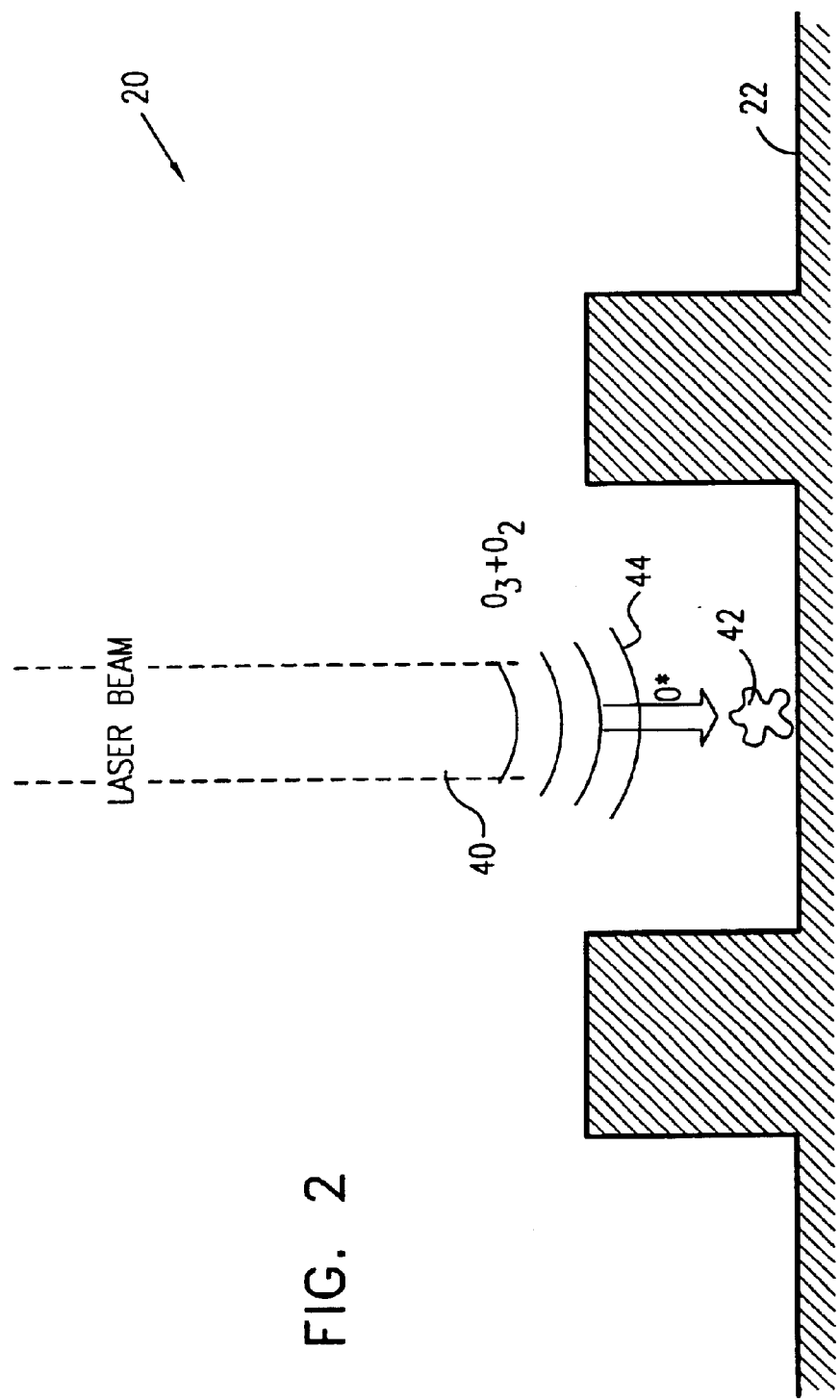
FIG. 2 is a schematic, sectional view of the surface of a semiconductor wafer, illustrating a method for removal of contaminants from the surface, in accordance with a preferred embodiment of the present invention.

FIG. 2 is a schematic, sectional view of a detail of the surface of wafer 22, illustrating a method for removal of contaminants from the surface, in accordance with a preferred embodiment of the present invention. The contaminants are represented symbolically by a particle 42. The process gases in chamber 26 include ozone in high concentration, preferably greater than 20 g/m$^3$, and most preferably about 150–250 g/m$^3$, so that most of the laser energy entering chamber 26 is absorbed by the ozone. The ozone is preferably diluted in oxygen at a relative concentration of about 10% and a total pressure of about 1–2 atm, with a flow rate through the chamber between about 2 and 15 liter/min.

Intense laser radiation in region 40, above the surface of the wafer, causes rapid conversion of ozone ($O_3$) into molecular oxygen ($O_2$) plus oxygen radicals (O). The laser energy density is typically between about 100 and 400 mJ/cm$^2$, in a region between 0.5 and 10 mm above the wafer surface (defined by the distance between window 38 and wafer 22). The photochemical decomposition of the ozone generates an exothermic chain reaction, leading to a blast wave, represented in the figure by a wavefront 44, which dislodges contaminants such as particle 42 from the surface.

The oxygen radicals created in the blast cooperate with the blast wave to increase the efficacy of contaminant removal in at least two ways:

Oxidizing reactions between the radical and organic particles that have been blown off the wafer surface, causing the particles to undergo complete combustion, wherein the combustion products are carried away with the exhaust gases.

Etching of contaminants on the wafer surface, particularly organic contaminants, such as photoresist residues. Undercutting these contaminants by the oxygen radicals reduces the blast force needed to dislodge stubborn residues from the surface.

The inventors have found that the combined effects of the blast wave and oxygen radical reactions are sufficient to clean the wafer surface of organic residues, even while holding the laser energy density below an ablation threshold of the residues. Thus, by reducing the laser flux that is incident on the wafer surface, this method also reduces the likelihood of damage to the wafer due to UV radiation or thermal effects of the laser beam. Photochemical interaction of the laser beam with the wafer surface, even without ablation, can also contribute to the removal of the residues.

Figure 3:
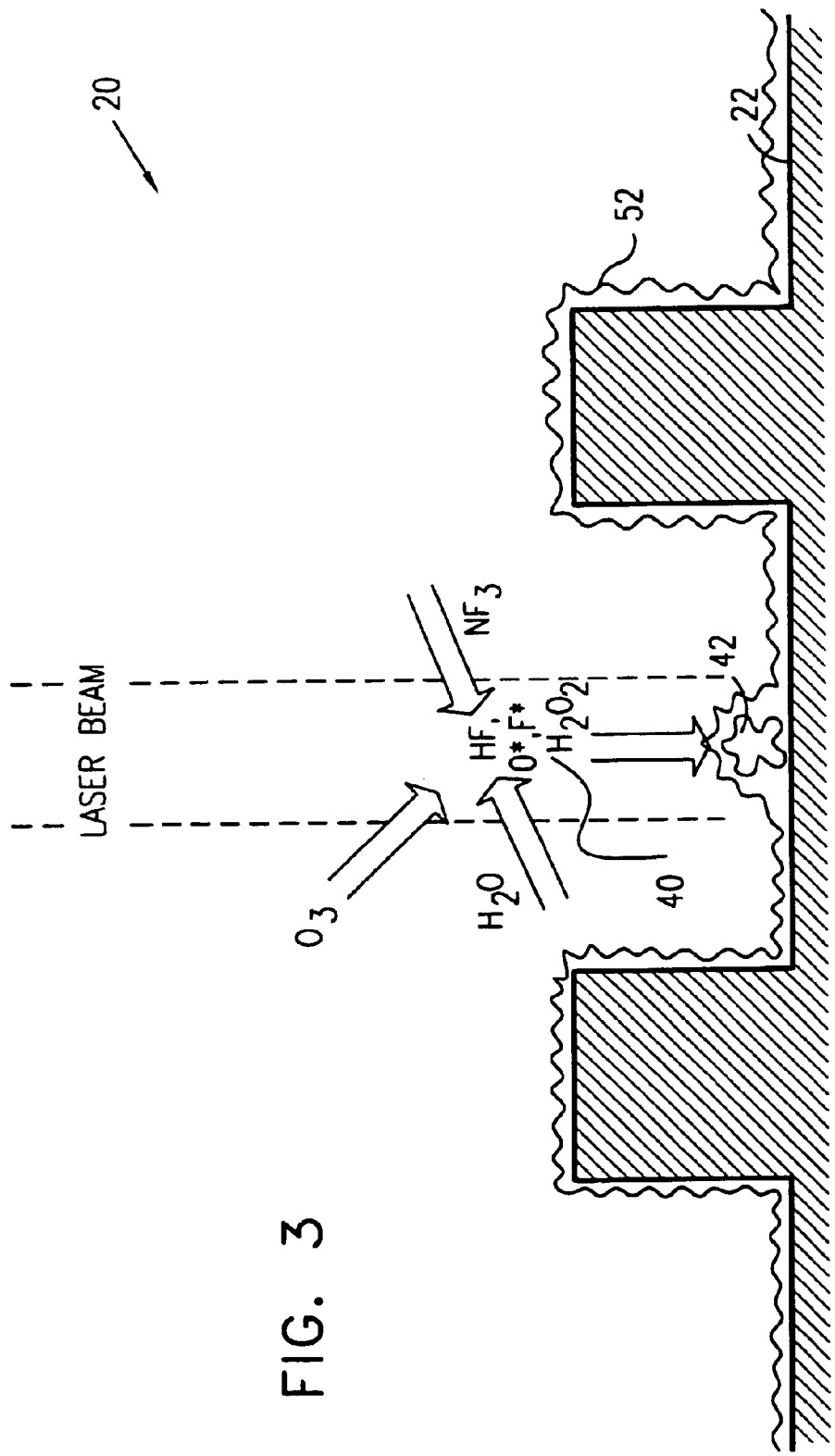
FIG. 3 is a schematic, sectional view of the surface of a semiconductor wafer, illustrating another method for removal of contaminants from the surface, in accordance with a preferred embodiment of the present invention.

FIG. 3 is a schematic, sectional view of a detail of the surface of wafer 22, illustrating another method for removal of contaminants from the surface, in accordance with a preferred embodiment of the present invention. In this embodiment, the surface is coated with a thin layer 52 of a fluid medium, typically water. Preferably, the water is introduced into chamber 26 as vapor, and then condenses on the wafer surface. Laser irradiation of the wafer surface by the laser beam causes rapid heating of the water, leading to explosive evaporation as described, for example, in the above-mentioned U.S. Pat. No. 4,987,2864. The heating may take place due either to absorption of the laser radiation in the water itself, particularly if a mid-infrared laser is used, or due to heating of the wafer surface with ensuing heat transfer to the water, or due to both mechanisms simultaneously.

As in the embodiment of FIG. 2, contaminants are simultaneously dislodged from the wafer surface by a blast wave, in this case due to the explosive evaporation, and attacked by photochemically-produced reactive species. To produce such species, the process gas in FIG. 3 preferably includes a fluorine compound, such as $NF_3$. The fluorine compound reacts with the heated water vapor to produce reactive species such as HF. Production of the reactive species may be catalyzed by photodissociation of the fluorine compound due to the laser radiation, which also generates radicals such as atomic fluorine. Alternatively or additionally, the process gas includes an oxygen compound, such as ozone, which reacts with the water vapor to produce highly-reactive $H_2O_2$, as well as generating radicals such as atomic oxygen, as described above.

By contrast to the present invention, methods of laser steam cleaning known in the art rely solely on explosive evaporation, and do not take advantage of reactive products. The hot environment created by the heated water vapor in the embodiment of FIG. 3 tends to increase the reactivity of the fluorine- or oxygen-containing species. These species are particularly effective in removing organic residues from the wafer surface without harming the underlying structures on the wafer.

The contaminant removal method exemplified by FIG. 3 is particularly applicable to removal of photoresist residues following etching, or for removal of oxide "veils" that may remain, particularly inside vias, after ashing of the etched photoresist. Such veils are a recognized phenomenon in the art of semiconductor wafer processing, causing problems that are not adequately addressed by methods of contaminant removal known in the art.

In one experiment, a wafer with such veils in its vias was processed in the configuration of FIG. 3. For this purpose, the chamber was filled to a pressure between about 0.3 to 1 atm, with $NF_3$ gas flowing through the chamber at a rate between 0.05 and 2.5 liter/min and ozone at about 40 to 200 g/m$^3$ in an oxygen flow of 2 to 15 liter/min. In addition, steam flowed through the chamber as water saturated in the oxygen carrier gas at about 1 to 10 liter/min, with a temperature between about 40° C. and 80° C. It was found that mixing the water with isopropyl alcohol tended to improve the wetting of the wafer. A laser flux between 50 and 300 mJ/cm$^2$ under these conditions was found to engender complete removal of the veils, substantially without damage to an aluminum nitride layer underlying the vias or silicon dioxide surrounding them.

Figure 4:
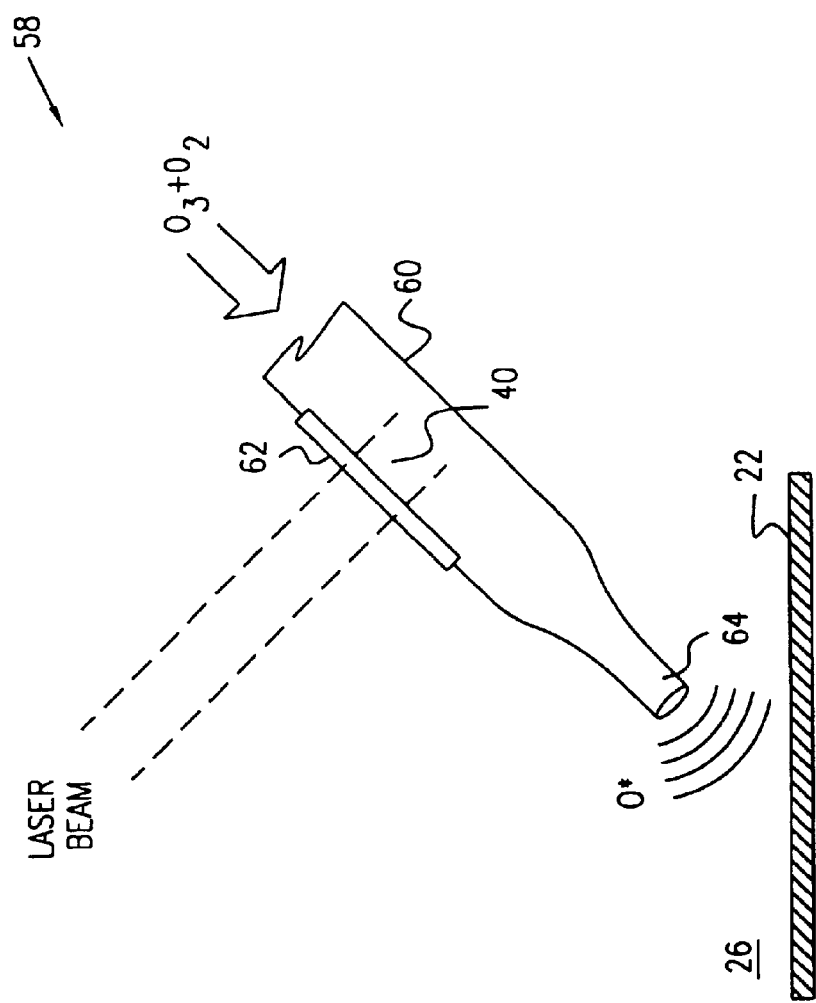
FIG. 4 is a schematic side view of a system for removal of contaminants from the surface of a semiconductor wafer, in accordance with another preferred embodiment of the present invention.

FIG. 4 is a schematic side view of a system 58 for removal of contaminants from the surface of wafer 22, in accordance with another preferred embodiment of the present invention. This embodiment is similar to that illustrated by FIGS. 1 and 2, except that in this case, a container, preferably a tube 60, is provided to convey a mixture of ozone in oxygen into chamber 26. The laser beam passes through a window 62 in the side of tube 60, causing rapid decomposition of the ozone in region 40, in a manner similar to that described above. Tube 60 directs the blast wave and excited oxygen radicals that are generate in region 40 through an outlet 64 toward an area to be cleaned on wafer 22. The blast wave and radicals are thus concentrated in the desired area and direction, while the wafer itself is subjected to little or no laser radiation. Particle removal from the wafer may thus be optimized, while minimizing the possibility of radiation or thermal damage to the wafer.

It will be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. Apparatus for removing contaminants from the surface of a substrate, comprising:

a chamber, adapted to receive the substrate and having an inlet for introduction therethrough of an explosive medium comprising ozone into a vicinity of the substrate and an outlet for removal of the contaminants; and a source of electromagnetic energy, configured to direct a beam of the electromagnetic energy into the chamber, such that absorption of the electromagnetic energy in the chamber causes the explosive medium both to generate a blast wave and to form reactive species, the blast wave and the reactive species cooperating to remove the contaminants from the surface substantially without damage to the surface itself, wherein the beam of the electromagnetic energy has a wavelength and energy flux selected so as to cause explosive decomposition of the explosive medium, substantially without dependence on photoionization due to the beam.

2. Apparatus according to claim 1, wherein the source of electromagnetic energy comprises a laser.

3. Apparatus according to claim 1, wherein the substrate comprises a semiconductor wafer.

4. Apparatus according to claim 1, wherein the explosive medium comprises water, which evaporates explosively upon absorption of the electromagnetic energy.

5. Apparatus according to claim 1, wherein the chamber comprises a container, coupled to the inlet so as to receive the explosive medium, the container having an outlet in proximity to the substrate and comprising a window that is substantially transparent to the electromagnetic energy, and wherein the source of electromagnetic energy is configured to direct the beam through the window of the container, so as to generate the blast wave and the reactive species at the outlet of the container.

6. Apparatus for removing contaminants from the surface of a substrate, comprising:

a chamber, adapted to receive the substrate and having an inlet for introduction therethrough of a fluid to coat the substrate and for introduction of a process gas into a vicinity of the substrate, and an outlet for removal of the contaminants; and a source of electromagnetic energy, configured to direct a beam of the electromagnetic energy into the chamber, such that absorption of the electromagnetic energy in the chamber causes the fluid to evaporate explosively so as to dislodge the contaminants from the surface, and to react with the gas so as to generate reactive species, which react with the contaminants.

7. Apparatus according to claim 6, wherein the fluid comprises water.

8. Apparatus according to claim 6, wherein the reactive gas comprises a fluorine compound.

9. Apparatus according to claim 6, wherein the reactive gas comprises an oxygen compound.

10. Apparatus according to claim 6, wherein the source of electromagnetic energy comprises a laser.

11. Apparatus according to claim 6, wherein the substrate comprises a semiconductor wafer.

* * * * *